(12) United States Patent
Wu et al.

(10) Patent No.: US 7,238,969 B2
(45) Date of Patent: Jul. 3, 2007

(54) SEMICONDUCTOR LAYOUT STRUCTURE FOR ESD PROTECTION CIRCUITS

(75) Inventors: Yi-Hsun Wu, Hsin-Chu (TW); Kuan-Lun Chang, Hsinchu County (TW); Chuan-Ying Lee, Hsin-Chu (TW); Jian-Hsing Lee, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 137 days.

(21) Appl. No.: 11/152,440

(22) Filed: Jun. 14, 2005

(65) Prior Publication Data

US 2006/0278928 A1   Dec. 14, 2006

(51) Int. Cl.
  *H01L 29/72* (2006.01)
  *H01L 29/74* (2006.01)
  *H01L 31/111* (2006.01)
  *H01L 23/62* (2006.01)

(52) U.S. Cl. ............... 257/173; 257/360; 257/E29.181
(58) Field of Classification Search ............... 257/173, 257/360, E29.181
  See application file for complete search history.

(56) References Cited

U.S. PATENT DOCUMENTS

| | | | | |
|---|---|---|---|---|
| 5,359,211 A | * | 10/1994 | Croft | 257/173 |
| 6,876,041 B2 | * | 4/2005 | Lee et al. | 257/358 |
| 6,900,969 B2 | * | 5/2005 | Salling et al. | 361/56 |
| 7,109,533 B2 | * | 9/2006 | Kodama | 257/173 |
| 2003/0102485 A1 | * | 6/2003 | Chen et al. | 257/119 |
| 2003/0179523 A1 | * | 9/2003 | Kodama | 361/56 |
| 2003/0218841 A1 | * | 11/2003 | Kodama | 361/56 |
| 2004/0114287 A1 | * | 6/2004 | Salling et al. | 361/56 |
| 2004/0195629 A1 | * | 10/2004 | Lai et al. | 257/355 |
| 2005/0082618 A1 | * | 4/2005 | Wu et al. | 257/355 |
| 2005/0195540 A1 | * | 9/2005 | Streibl et al. | 361/56 |
| 2005/0254189 A1 | * | 11/2005 | Wu et al. | 361/56 |
| 2005/0270710 A1 | * | 12/2005 | Ker et al. | 361/56 |
| 2006/0050453 A1 | * | 3/2006 | Duvvury et al. | 361/56 |
| 2006/0151836 A1 | * | 7/2006 | Salcedo et al. | 257/362 |
| 2006/0192251 A1 | * | 8/2006 | Yu et al. | 257/362 |
| 2006/0215337 A1 | * | 9/2006 | Wu et al. | 361/56 |
| 2006/0268478 A1 | * | 11/2006 | Lai et al. | 361/56 |
| 2006/0274465 A1 | * | 12/2006 | Wu et al. | 361/56 |

* cited by examiner

Primary Examiner—Ngân V. Ngô
(74) Attorney, Agent, or Firm—K & L Gates LLP

(57) ABSTRACT

A semiconductor layout structure for an electrostatic discharge (ESD) protection circuit is disclosed. The semiconductor layout structure includes a first area, in which one or more devices are constructed for functioning as a silicon controlled rectifier, and a second area, in which at least one device is constructed for functioning as a trigger source that provides a triggering current to trigger the silicon controlled rectifier for dissipating ESD charges during an ESD event. The first area and the second area are placed adjacent to one another without having a resistance area physically interposed or electrically connected therebetween, such that the triggering current received by the silicon controlled rectifier is increased during the ESD event.

18 Claims, 5 Drawing Sheets

SEMICONDUCTOR LAYOUT STRUCTURE FOR ESD PROTECTION CIRCUITS

RELATED APPLICATION

This application is related to and claims the priority benefit of U.S. patent application Ser. No. 11/091,131 entitled "ESD PROTECTION CIRCUIT WITH LOW PARASITIC CAPACITANCE" filed Mar. 28, 2005.

BACKGROUND

The present invention relates generally to an integrated circuit (IC) design, and more particularly to a semiconductor layout structure for electrostatic discharge (ESD) protection circuits.

A gate oxide of a metal-oxide-semiconductor (MOS) transistor of an IC is most susceptible to damage. The gate oxide may be destroyed by being contacted with a voltage only a few volts higher than a supply voltage of the IC. It is understood that a regular supply voltage for an IC is about 5.0, 3.3 volts or even lower. Electrostatic voltages from common environmental sources can easily reach thousands, or even tens of thousands of volts. Such voltages can be destructive even though the charge and any resulting current are extremely small. For this reason, it is of critical importance to discharge any static electric charge before it damages the IC.

An ESD protection circuit is typically added to an IC at its bond pads. Such protection circuit must allow normal operation of the IC. It means that the protection circuit is effectively isolated from the normally operating core circuit by blocking a current flow through itself to ground or other pads. In an operating IC, electric power is supplied to a VCC pad, electric ground is supplied to a VSS pad, electronic signals are supplied from outside to some pads, and electronic signals generated by the core circuit of the IC are supplied to other pads for delivery to external circuits or devices. In an isolated, unconnected IC, all pads are considered to be electrically floating, or of indeterminate voltages. In most cases, this means the pads are at ground, or zero voltage.

The ESD can arrive at any pad. This can happen, for example, when a person touches some of the pads on the IC. This is the same static electricity that may be painfully experienced by a person who walks across a carpet on a dry day and then touches a grounded metal object. In an isolated IC, the ESD acts as a brief power supply for one or more pads, while the other pads remain floating, or grounded. Because the other pads are grounded, when ESD acts as a power supply at a randomly selected pad, the protection circuit acts differently than it does when the IC is operating normally. When an ESD event occurs, the protection circuit must quickly become conductive so that the electrostatic charge is dissipated to VSS or ground.

The ESD protection circuit, therefore, has two modes: normal operation mode and ESD mode. When an IC is in the normal operation mode, the ESD protection circuit has no effect to the IC. During the ESD mode, the ESD protection circuit serves its purpose of protecting the IC by conducting an electrostatic charge quickly to VSS or ground before it damages the IC.

As technology in circuit designs continue to grow and lower supply voltages are being used, circuits become more vulnerable to early stages of ESD events. Even voltage slightly higher than the supply voltage can damage the IC and the protection circuit itself. It has been found that parasitic four layer PNPN devices called parasitic silicon controlled rectifier (SCR) can be one of the most effective devices in preventing ESD damage due to its low turn-on impedance, low capacitance, low power dissipation, and high current sinking/sourcing capabilities. By using a NMOS transistor to trigger an SCR, a low triggering voltage ESD protection circuit can be achieved.

The conventional SCR ESD protection circuit may have parasitic capacitance and resistance that may create undesired consequences when the SCR ESD protection circuit is used in a high frequency IC. The shortcomings of the parasitic capacitance and resistance include, for example, noise, signal reflection, and reduced power gain.

It is therefore desired to provide a semiconductor layout structure for a SCR ESD protection circuit with a reduced parasitic capacitance and resistance.

SUMMARY

This invention provides a semiconductor layout structure for an electrostatic discharge (ESD) protection circuit. In one embodiment of the present invention, the semiconductor layout structure includes a first area, in which one or more devices are constructed for functioning as a silicon controlled rectifier, and a second area, in which at least one device is constructed for functioning as a trigger source that provides a triggering current to trigger the silicon controlled rectifier for dissipating ESD charges during an ESD event. The first area and the second area are placed adjacent to one another without having a resistance area physically interposed or electrically connected therebetween, such that the triggering current received by the silicon controlled rectifier is increased during the ESD event.

The construction and method of operation of the invention, however, together with additional objects and advantages thereof will be best understood from the following description of specific embodiments when read in connection with the accompanying drawings.

DESCRIPTION

Figure 1:
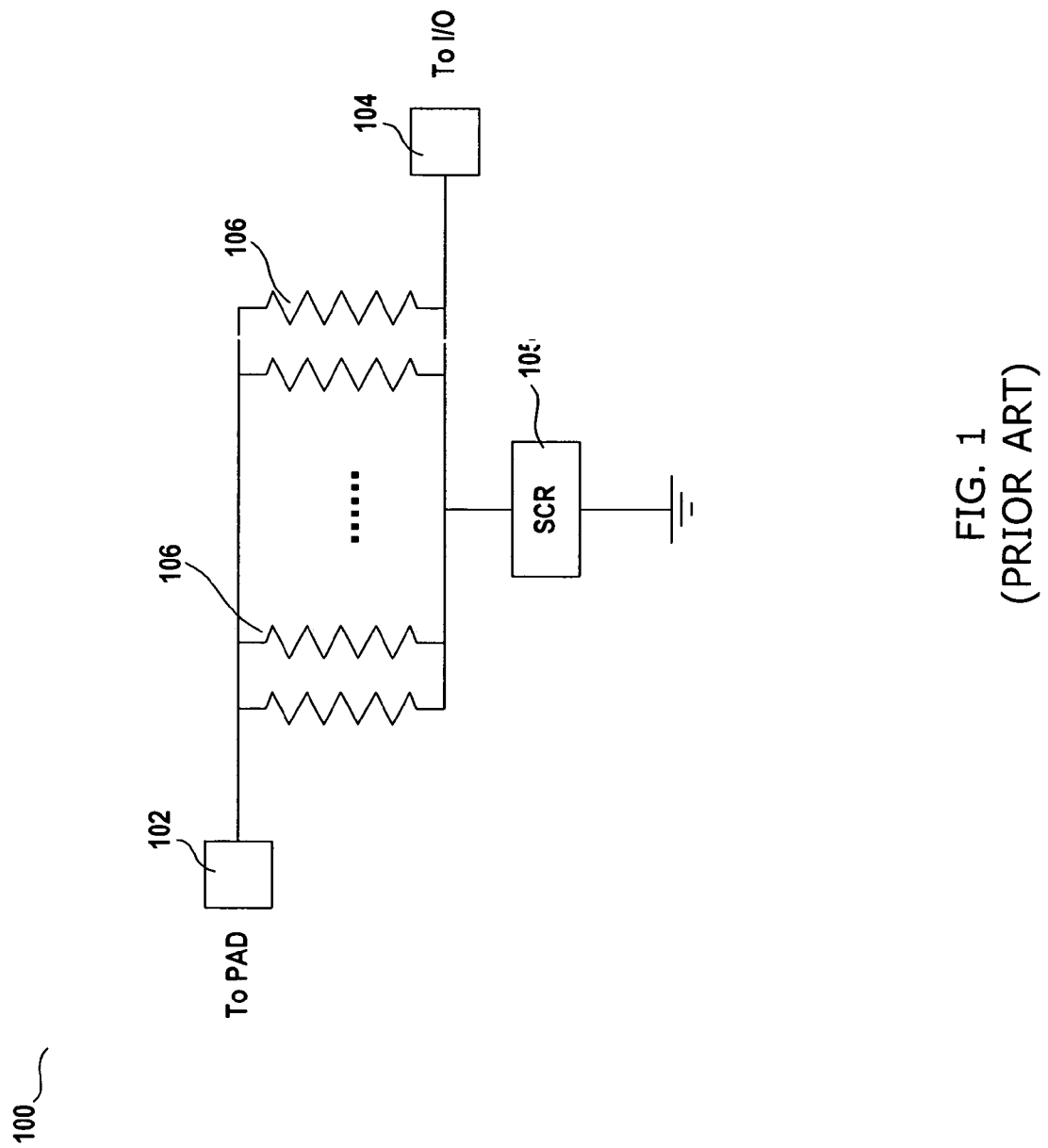
FIG. 1 illustrates a circuit diagram of an ESD protection circuit.

FIG. 1 illustrates a circuit diagram 100 of a conventional ESD protection circuit system, which is used for providing ESD protection for a high frequency IC. The conventional ESD protection circuit system is implemented with an SCR circuit 105, which typically includes a trigger source (not shown in this figure). During an ESD event, the trigger source produces a triggering current to turn on the SCR circuit 105 for dissipating an ESD current from the pad 102 to ground. The trigger source, which typically includes a set of transistors, may be easily damaged by a high voltage caused by the ESD event. In order to protect the trigger source from damage, one or more resistors 106 are provided between the pad 102, from which the ESD current may enter in to the system 100, and an I/O pad 104, which is tied to a protected circuit or device. The resistors 106 may be provided in a parasitic or non-parasitic form. Due to the resistance provided by the resistors 106, the ESD current from the pad 102 is limited and not able to flow through to damage internal transistors of the trigger source.

One drawback of the ESD protection circuit system 100 occurs when it is applied in high frequency ICs. With the resistance provided by the resistors 106, issues such as signal reflection, reduced power gain, and induced noise can be observed. Thus, it is desired to provide a semiconductor layout structure for the ESD protection circuit system 100 that eliminates the resistors 106 while it protects the trigger source within the SCR circuit 105 from damage.

Figure 2A:
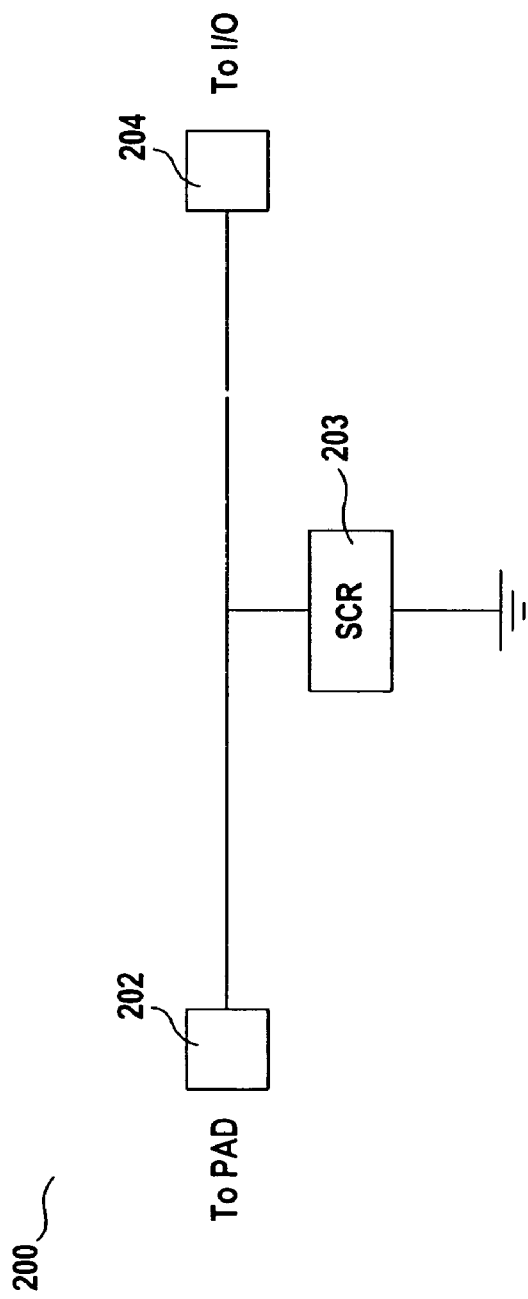
FIG. 2A illustrates a circuit diagram of an ESD protection circuit in accordance with one embodiment of the present invention.

FIG. 2A illustrates a circuit diagram 200 of an ESD protection circuit system in accordance with one embodiment of the present invention. This proposed system includes an SCR circuit 203 coupled between a pad 202, from which the ESD current enters into the system 200, and an I/O pad 204, which is tied to a protected circuit or device. With a semiconductor layout structure that will be further explained by the following embodiments of the invention, no resistors need to be provided between the pad 202 and the I/O pad 204 in order to protect a trigger source (not shown in the figure) within the SCR circuit 203. The proposed layout structure provides the SCR circuit 203 with a very low parasitic resistance and capacitance, so that the SCR circuit 203 can be turned on much sooner as opposed to that shown in FIG. 1 during the ESD event.

Figure 2B:
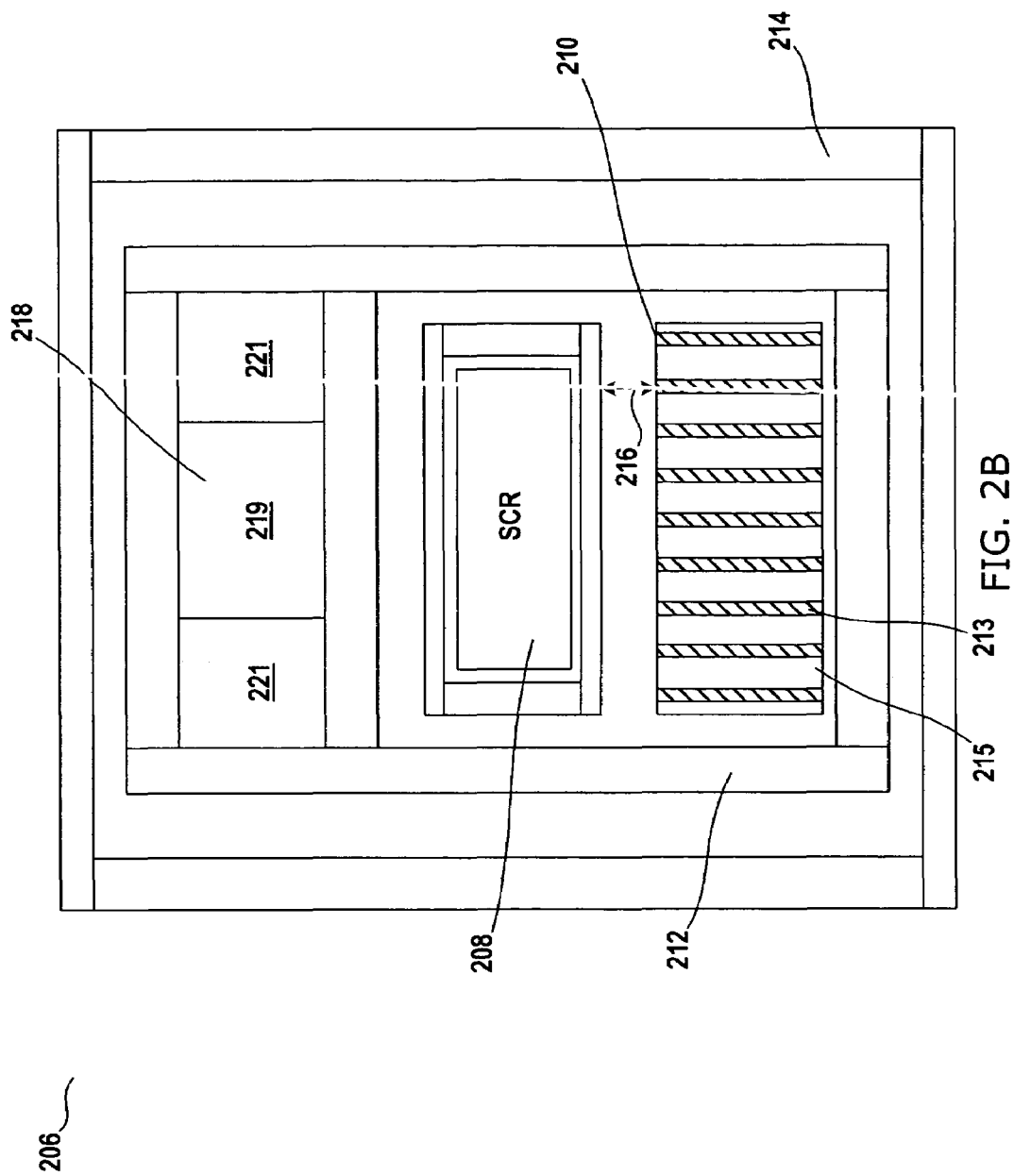
FIG. 2B illustrates a semiconductor layout structure for the ESD protection circuit shown in FIG. 2A in accordance with one embodiment of the present invention.

FIG. 2B illustrates a semiconductor layout structure 206 for the ESD protection circuit system shown in FIG. 2A in accordance with one embodiment of the present invention. The layout structure 206 includes an SCR area 208 and a trigger source area 210 placed within a P+ guard ring 212 and an N+ guard ring 214. Within the SCR area 208, one or more devices are constructed by a combination of different material layers of various doping conditions for collectively functioning as an SCR circuit. Within the trigger source area 210, a set of transistors are constructed for providing a triggering current for turning on the SCR circuit during the ESD event. In this embodiment, a set of fully silicided ground-gate NMOS transistors are constructed within the trigger source area 210 for providing such triggering current. The trigger source area 210 may include one or more poly-silicon gate regions 213 extending through one or more doped source/drain regions 215. A spacing gap 216 is left opened between the SCR area 208 and the trigger source area 210 without any resistance area physically interposed or electrically connected therebetween. The distance of the spacing gap 216 is crucial since it affects the amount of the triggering current reaching the SCR area 208. In one embodiment, the shortest distance between the SCR area 208 and the trigger source area 210 ranges from about 2 to 10 μms.

The SCR area 208 and the trigger source area 210 are placed within the P+ guard ring area 212, which is further placed within the N+ guard ring area 214. No part or segment of the P+ guard ring area is present between the SCR area 208 and the trigger source area 210. The P+ guard ring area 212 is constructed to collect the holes and should be connected to a substrate potential. The N+ guard ring area 214 is constructed to collect the electrons and is connected to a relatively high-voltage potential. A diode area 218 is placed above the SCR area 208 within the P+ guard ring area 212. Within the diode area 218, an N-well region 219 is placed between P-well regions 221 for constructing a diode to clamp the ESD voltage during the ESD events.

During the ESD event, the grounded gate NMOS transistors, which are represented by the poly-silicon gate regions 213 and doped source/drain regions 215, within the trigger source area 210 will experience junction breakdown and produce the triggering current for the SCR circuit (not shown) within the SCR area 208. Due to the absence of any resistance area between the SCR area 208 and the trigger source area 210, the triggering current reaching the SCR area 208 is increased for turning on the SCR circuit earlier during the ESD current. The distance of the spacing gap 216 affects the amount of triggering current that can reach the SCR area 208 from the trigger source area 210. This allows the SCR circuit within the SCR area 208 to be triggered on earlier.

By removing the resistors between the SCR area 208 and the trigger source area 210, the issues of using the conventional ESD protection circuit system in a high frequency IC, such as signal reflection, reduced power gain, and induced noise, are improved. The layout structure improves the applicability of the SCR ESD protection circuit in high frequency ICs.

Figure 2C:
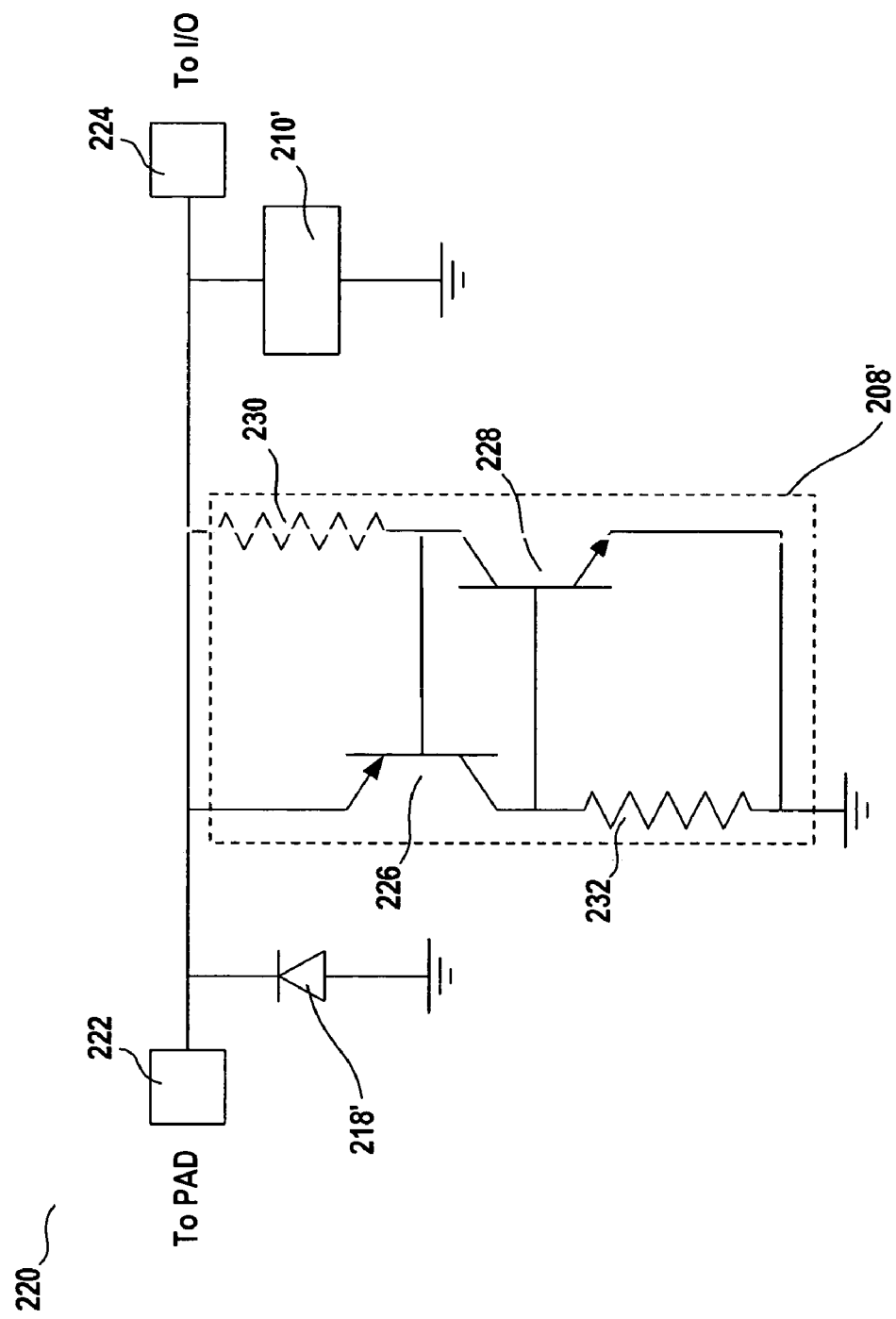
FIG. 2C illustrates a detailed circuit diagram equivalent of the semiconductor layout structure shown in FIG. 2B.

FIG. 2C illustrates an exemplary equivalent circuit diagram 220 of the layout structure 206 shown in FIG. 2B. The circuit diagram 220 includes an SCR circuit 208', a trigger source 210', and a diode 218'. The SCR circuit 208', the trigger source 210', and the diode 218' are all coupled between a pad 222 and an I/O pad 224. The diode 218' is designed to clamp the ESD voltage generated during an ESD event. The SCR circuit 208' includes two parasitic bipolar transistors 226 and 228 and a parasitic resistance represented by resistors 230 and 232. The trigger source 210' typically includes a set of grounded-gate NMOS transistors (not shown in this figure).

Figure 3:
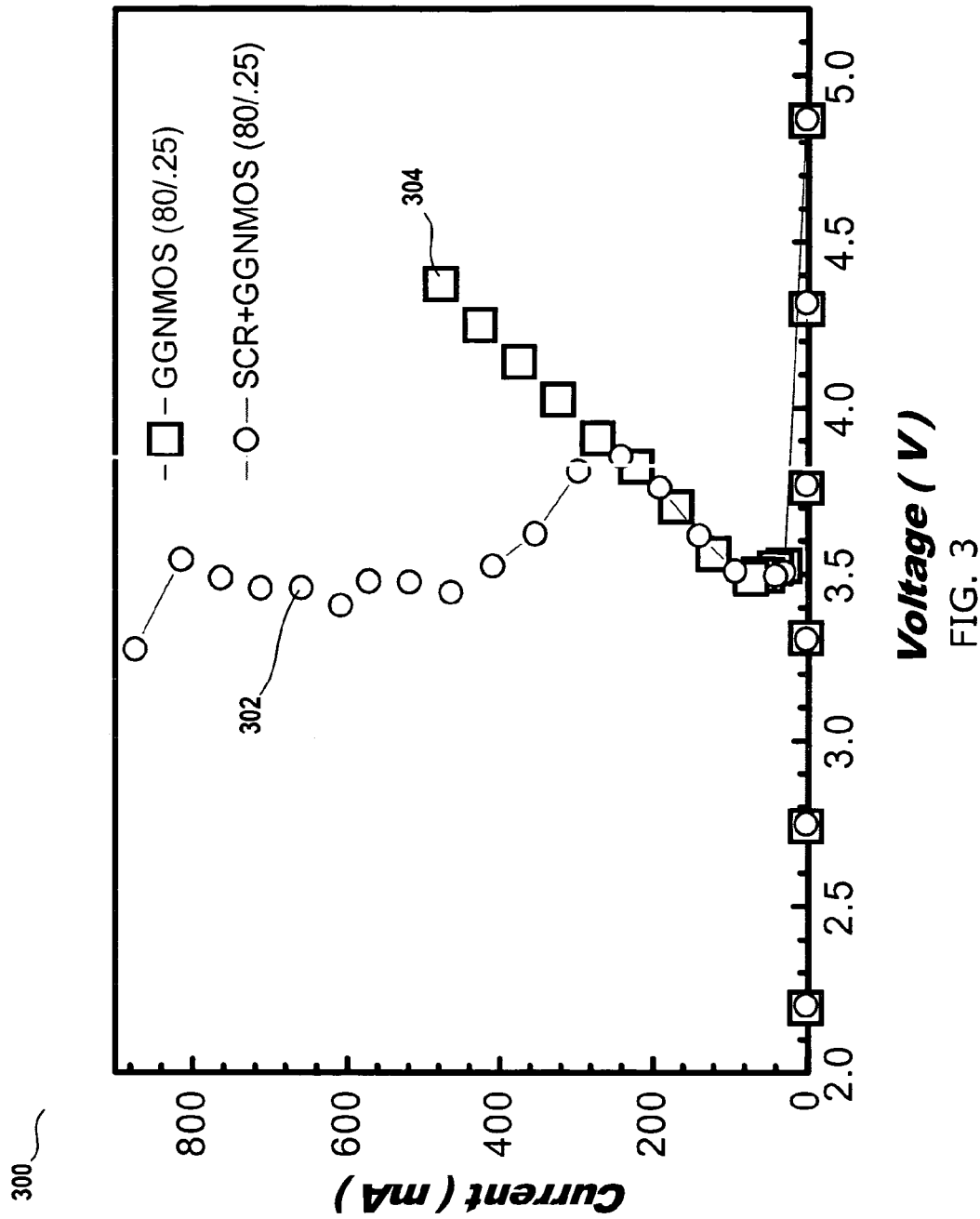
FIG. 3 illustrates a graph representing test results of ESD protection circuits constructed by various layout structures.

FIG. 3 illustrates a graph representing the test results of the ESD performance of various devices. A curve 302 represents the ESD performance of a protection circuit with both a SCR and a ground-gate NMOS transistor constructed according to the proposed layout structure, while a curve 304 represents the ESD performance of a protection circuit with only a ground-gate NMOS transistor. Both circuits have a total width of 80 μms and total a length of 0.25 μm. For the circuit with the SCR, the curve 302 snaps back at a voltage level of about 3.8 V, and the triggering current keeps increasing beyond about 300 mA, which is usually the benchmark for a sufficient triggering current. For the circuit without the SCR, the curve 304 never snaps back, and the voltage level keeps increasing after the triggering current reaches about 300 mA. This increasing voltage may cause damage to the grounded-gate NMOS transistor.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor layout structure for an electrostatic discharge (ESD) protection circuit, comprising:
    a first area in which one or more devices are constructed for functioning as a silicon controlled rectifier;
    a second area in which at least one device is constructed for functioning as a trigger source that provides a triggering current to trigger the silicon controlled rectifier for dissipating ESD charges during an ESD event; and
    a third area in which at least one diode is provided for clamping an ESD voltage during the ESD event,
    wherein the first area and the second area are placed adjacent to one another without having a resistance area physically interposed or electrically connected therebetween, such that the triggering current received by the silicon controlled rectifier is increased during the ESD event, and at least one device in the second area includes a grounded-gate NMOS transistor.

2. The semiconductor layout structure of claim 1 wherein a shortest distance between the first and second areas is within a range between about 2 and 10 μms.

3. The semiconductor layout structure of claim 1 further comprising a first guard ring area surrounding the first and second areas.

4. The semiconductor layout structure of claim 3 wherein the first guard ring area is doped with P-type impurities.

5. The semiconductor layout structure of claim 4 further comprising a second guard ring area surrounding the first guard ring area.

6. The semiconductor layout structure of claim 5 wherein the second guard ring area is doped with N-type impurities.

7. The semiconductor layout structure of claim 1 wherein the grounded gate NMOS transistor comprises at least one poly-silicon gate region extending through at least one doped source/drain region within the second area.

8. A semiconductor layout structure for an electrostatic discharge (ESD) protection circuit, comprising:
    a first area in which one or more devices are constructed for functioning as a silicon controlled rectifier;
    a second area in which at least one device is constricted for function as a trigger source that provides a triggering current to trigger the silicon controlled rectifier for dissipating ESD charges during an ESD event;
    a third area in which at least one diode is provided for clamping an ESD voltage during the ESD event; and
    a first guard ring area surrounding the first and second areas,
    wherein the first area and the second area are placed adjacent to one another without having a resistance area and a segment of the first guard ring area physically interposed or electrically connected therebetween, such that the triggering current received by the silicon controlled rectifier is increased during the ESD event, and at least one device in the second area includes a grounded-gate NMOS transistor.

9. The semiconductor layout structure of claim 8 wherein a shortest distance between the first and second areas is within a range between about 2 and 10 μms.

10. The semiconductor layout structure of claim 8 wherein the first guard ring area is doped with P-type impurities.

11. The semiconductor layout structure of claim 10 further comprising a second guard ring area surrounding the first guard ring area.

12. The semiconductor layout structure of claim 11 wherein the second guard ring area is doped with N-type impurities.

13. A semiconductor layout structure for an electrostatic discharge (ESD) protection circuit, comprising:
    a first area in which one or more devices are constructed for functioning as a silicon controlled rectifier;
    a second area in which at least one device is constructed for function as a trigger source that provides a triggering current to trigger the silicon controlled rectifier for dissipating ESD charges during an ESD event;
    a third area in which at least one diode is provided for clamping an ESD voltage during the ESD event; and
    a P-type guard ring area surrounding the first and second areas,
    wherein the first area and the second area are spaced by a shortest distance ranging from about 2 to 10 μms, without having a resistance area and a segment of the P-type guard ring area physically interposed or electrically connected therebetween, such that the triggering current received by the silicon controlled rectifier is increased during the ESD event, and at least one device in the second area includes a ground-gate NMOS transistor.

14. The semiconductor layout structure of claim 13 further comprising an N-type guard ring area surrounding the P-type guard ring area.

15. The semiconductor layout structure of claim 13 wherein at least one diode includes a PN junction diode whose anode is grounded.

16. The semiconductor layout structure of claim 15 wherein the PN junction diode is placed within the P-type guard ring.

17. The semiconductor layout structure of claim 16 wherein the PN junction diode is constructed between an N-well region and P-well region.

18. The semiconductor layout structure of claim 13 wherein the P-type guard ring is coupled to a substrate potential to collect holes generated during the ESD event.

* * * * *